(12) United States Patent
Hassan et al.

(10) Patent No.: US 11,515,164 B2
(45) Date of Patent: Nov. 29, 2022

(54) INTEGRATED PHOTONIC DEVICE MANUFACTURING METHOD

(71) Applicant: Commissariat à l'Énergie Atomique et aux Énergies Alternatives, Paris (FR)

(72) Inventors: Karim Hassan, Grenoble (FR); Corrado Sciancalepore, Grenoble (FR); Bertrand Szelag, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 17/090,639

(22) Filed: Nov. 5, 2020

(65) Prior Publication Data
US 2021/0134601 A1     May 6, 2021

(30) Foreign Application Priority Data
Nov. 6, 2019 (FR) ...................... 1912437

(51) Int. Cl.
*H01L 21/306* (2006.01)
*H01L 21/304* (2006.01)
*H01L 25/04* (2014.01)
*G02B 6/12* (2006.01)
*H01L 31/18* (2006.01)

(52) U.S. Cl.
CPC ...... *H01L 21/30604* (2013.01); *H01L 21/304* (2013.01); *H01L 25/043* (2013.01); *H01L 31/18* (2013.01)

(58) Field of Classification Search
CPC .................. H01L 25/043; H01L 31/18; H01L 21/30604; H01L 21/304; H01L 33/0093; G02B 6/12004; G02B 6/13; G02B 6/43; H01S 3/0637
See application file for complete search history.

(56) References Cited

U.S. PATENT DOCUMENTS

| 6,852,556 | B2 * | 2/2005 | Yap ..................... G02B 6/12004 438/22 |
| 8,213,751 | B1 * | 7/2012 | Ho ........................... G02B 6/43 385/14 |
| 9,864,136 | B1 * | 1/2018 | Jacob .................... H01L 31/103 |
| 2003/0089915 | A1 * | 5/2003 | Yap ..................... G02B 6/12004 257/82 |

(Continued)

FOREIGN PATENT DOCUMENTS

CA      3043644 A1     5/2018

OTHER PUBLICATIONS

Preliminary Search Report for French Application No. 1912437, dated Jul. 15, 2020.

(Continued)

*Primary Examiner* — Earl N Taylor
(74) *Attorney, Agent, or Firm* — Wolf, Greenfield & Sacks, P.C.

(57) ABSTRACT

A photonic device manufacturing method, including a step of transfer, onto a same surface of a photonic circuit previously formed inside and on top of a first substrate, of at least a first die made up of a III-V semiconductor material and of at least a second die made up of silicon nitride, the method further including a step of forming of photonic components in said at least one first and at least one second dies.

10 Claims, 3 Drawing Sheets

(56) References Cited

U.S. PATENT DOCUMENTS

| | | | |
|---|---|---|---|
| 2004/0155252 A1* | 8/2004 | Yap | G02B 6/12007 257/82 |
| 2014/0254978 A1* | 9/2014 | Koch | G02B 6/13 385/14 |
| 2015/0030282 A1* | 1/2015 | Park | G02B 6/12004 385/14 |
| 2016/0178861 A1* | 6/2016 | Osenbach | G02B 6/13 385/14 |
| 2018/0175150 A1* | 6/2018 | Mauder | H01L 21/02255 |
| 2021/0134601 A1* | 5/2021 | Hassan | H01L 31/18 |

OTHER PUBLICATIONS

Bauters et al., Silicon on ultra-low-loss waveguide photonic integration platform. Optics express. Jan. 14, 2013;21(1):544-55.

Pfeiffer et al., Photonic Damascene process for low-loss, high-confinement silicon nitride waveguides. IEEE Journal of Selected Topics in Quantum Electronics. Jun. 22, 2018;24(4):6101411.

Sacher et al., Multilayer silicon nitride-on-silicon integrated photonic platforms and devices. Journal of Lightwave Technology. Feb. 1, 2015;33(4):901-10.

FR1912437, Jul. 15, 2020, Preliminary Search Report.

\* cited by examiner

INTEGRATED PHOTONIC DEVICE MANUFACTURING METHOD

CROSS-REFERENCE TO RELATED APPLICATION

This application claims priority to French patent application number 1912437, filed Nov. 6, 2019, the contents of which is incorporated herein by reference in its entirety.

TECHNICAL BACKGROUND

The present disclosure concerns an integrated photonic device manufacturing method.

PRIOR ART

Known integrated photonic device manufacturing methods have various disadvantages.

It would be desirable to have an integrated photonic device manufacturing method overcoming all or part of the disadvantages of existing methods.

SUMMARY

For this purpose, an embodiment provides a photonic device manufacturing method, comprising a step of transfer, onto a same surface of a photonic circuit previously formed inside and on top of a first substrate, of at least one first die made up of a III-V semiconductor material and of at least a second die made up of silicon nitride, the method further comprising a step of forming of photonic components in said at least one first and at least one second dies.

According to an embodiment, the step of forming of photonic components in said at least one first and at last one second dies is subsequent to the transfer step.

According to an embodiment, the method further comprises, after the transfer step, a step of collective thinning of said at least one first and at least one second dies, by mechanical grinding from their surfaces opposite to the first substrate.

According to an embodiment, the method further comprises, after the transfer step, a step of removal, by chemical etching, of a growth substrate of said at least one first die, and a step of removal, by chemical etching, of a deposition substrate of said at least one second die.

According to an embodiment, during the transfer step, said at least one first and at least one second dies are simultaneously transferred onto the photonic circuit by means of a temporary support substrate.

According to an embodiment, during the transfer step, said at least one first and at least one second dies are fastened by molecular bonding onto said surface of the photonic circuit.

According to an embodiment, the molecular bonding implemented during the transfer step is a direct oxide-to-oxide bonding.

According to an embodiment, each second die comprises a stoichiometric $Si_3N_4$ layer deposited by LPCVD.

According to an embodiment, the method comprises, before the transfer step, a step of local doping of the first substrate for the forming of a PN junction of a component of the photonic circuit.

According to an embodiment, the first substrate is a substrate of silicon-on-insulator type.

According to an embodiment, the temporary support substrate is a flexible film.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various FIGURES. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the different active or passive components that the photonic devices formed by the described methods may comprise have not been detailed, the described embodiments being compatible with all or most of the usual components of integrated photonic devices.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the FIGURES.

Unless specified otherwise, the expressions "around", "approximately", "substantially" and "in the order of" signify within 10%, and preferably within 5%.

FIGS. 1A to 1G are cross-section views schematically and partially illustrating steps of an example of an integrated photonic device manufacturing method.

For simplification, FIGS. 1A to 1G show the forming of a single photonic device. In practice, a plurality of identical or similar photonic devices may be formed simultaneously inside and on top of a same substrate, the substrate being then cut into a plurality of individual chips, each comprising a single photonic device.

Figure 1A:
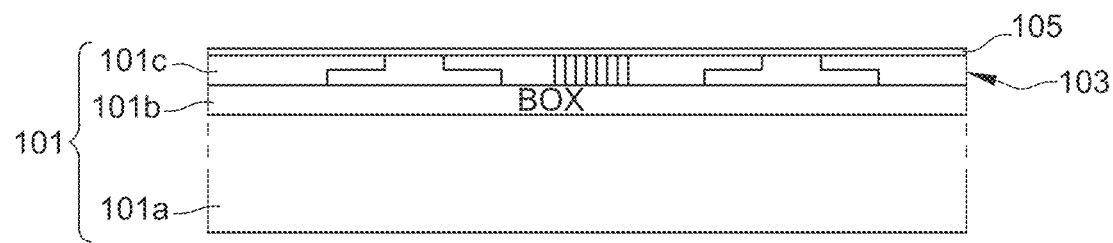
FIG. 1A illustrates a step of an integrated photonic device manufacturing method according to an embodiment.

FIG. 1A illustrates a structure obtained at the end of steps of forming of an integrated photonic circuit in a first substrate 101, for example, made up of silicon. Substrate 101 is for example a substrate of SOI type ("Silicon On Insulator"), comprising a silicon support 101a, an insulating layer 101b, for example, made of silicon oxide, arranged on top of and in contact with the upper surface of support 101a, and a silicon layer 101c arranged on top of and in contact with the upper surface of insulating layer 101b. Layers 101b and 101c for example each extend over substantially the entire surface of support 101a. Active or passive components 103 are formed in the upper silicon layer 110c of substrate 101, forming a first integrated photonic circuit. Components 103 for example comprise waveguides, diffraction gratings, photodiodes, PN junction modulators, and/or any other photonic component capable of being integrated in an SOI-type substrate. As a variant, layer 101c may comprise layers of germanium or of a silicon-germanium alloy, in which case components 103 may comprise components made up of germanium.

FIG. 1A further illustrates a step subsequent to the forming of components 103, of deposition of an insulating layer 105, for example, a silicon oxide layer, on the upper surface of substrate 101. Layer 105 for example extends continuously over the entire surface of substrate 101. The thickness of layer 105 is for example in the range from 5 to 100 nm, for example, from 70 to 80 nm.

Figure 1B:
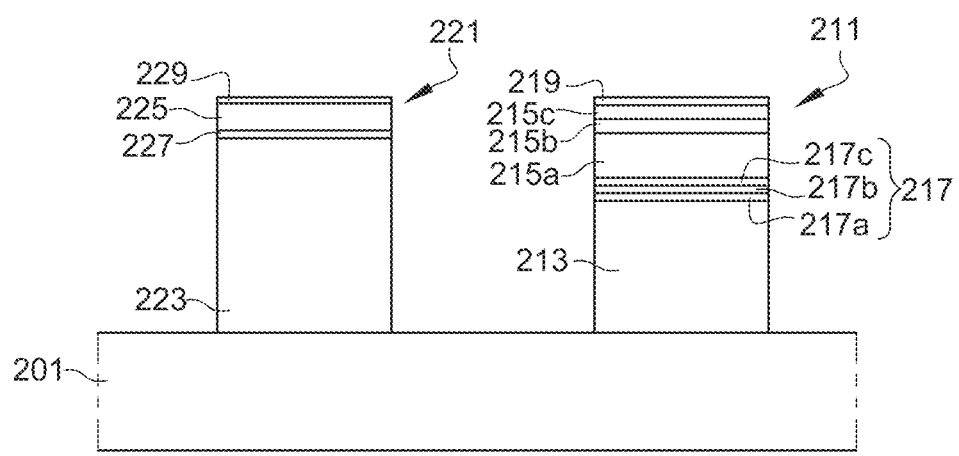
FIG. 1B illustrates another step of an integrated photonic device manufacturing method according to an embodiment.

FIG. 1B illustrates a step of fastening, to the upper surface of a temporary support substrate 201, of first dies 211 made up of a III-V semiconductor material, and of second dies 221 made up of silicon nitride. In FIG. 1B, a single die 211 and a single die 221 have been shown. Dies 211 and 221 are intended to be transferred onto substrate 101 to form, above the photonic components 103 integrated in substrate 101, photonic components made up of the III-V semiconductor material, for example, laser diodes, and photonic components made up of silicon nitride, for example, waveguides, intended to cooperate with components 103 to form a photonic device.

Temporary support substrate 201 for example has substantially the same surface area as substrate 101. The layout of dies 211 and 221 on substrate 201 corresponds to the desired layout of the dies after their transfer onto substrate 101. As an example, it may be provided to transfer one or a plurality of dies 211 and one or a plurality of dies 221 onto each integrated photonic circuit formed in substrate 101. Each die 211 or 221 may have, in top view, a minimum dimension in the range from 1 to 10 mm, for example, from 1 to 5 mm. As an example, in top view, each die 211 or 221 has a surface area in the range from 1 to 25 mm$^2$.

Dies 211 may be formed by epitaxy from a growth substrate 213. Each die may comprise a stack comprising, in the order from the upper surface (in the orientation of FIG. 1B) of substrate 213, a semiconductor layer 215a of a doped III-V material of a first conductivity type, for example, type P, an active layer 215b, and a semiconductor layer 215c of a doped III-V material of the second conductivity type, for example, type N. As an example, substrate 213 and semiconductor layers 215a and 215c are made of indium phosphide (InP). Active layer 215b may comprise confinement means corresponding to multiple quantum wells (succession of quantum wells and of barriers, surrounded by SCH-type ("separate confinement heterostructure") confinement layers). As an example, active layer 215b comprises an alternation of semiconductor layers of a first III-V material and of semiconductor layers of a second III-V material, each layer of the first material being sandwiched between two layers of the second material, the first material having a bandgap narrower than that of the second material. As an example, active layer 215b is arranged on top of and in contact with the upper surface of layer 215a, and layer 215c is arranged on top of and in contact with the upper surface of active layer 215b. Each die 211 may further comprise a stack 217 of one or a plurality of buffer layers forming an interface between the upper surface of substrate 213 and the lower surface of layer 215a. In the shown example, stack 217 comprises, in the order from the upper surface of substrate 213, a first semiconductor layer 217a arranged on top of and in contact with the upper surface of substrate 213, a second semiconductor layer 217b arranged on top of and in contact with the upper surface of layer 217a, and a third semiconductor layer 217c arranged on top of and in contact with the upper surface of layer 217b. In this example, the upper surface of layer 217c is in contact with the lower surface of layer 215a. Layer 217a is intended to form a first etch stop layer during a subsequent step of removal of substrate 213. Layer 217a is for example made of indium gallium arsenide (InGaAs). Layer 217b is intended to form a second etch stop layer during the subsequent step of removal of substrate 213. Layer 217b is for example made of indium phosphide. Layer 217c is intended to form a third etch stop layer and a layer of electric contact with layer 215a. Layer 217c is for example made of P-type doped gallium indium arsenide. In this example, each die 211 further comprises an insulating layer 219, for example, made of the same material as layer 105, arranged on the upper surface of semiconductor layer 215c, for example, in contact with the upper surface of layer 215c. The thickness of layer 219 is for example in the range from 5 to 50 nm, for example, from 10 to 20 nm.

As an example, layers 217a, 217b, 217c, 215a, 215b, and 215c are successively formed by epitaxy on the upper surface of growth substrate 213, before the cutting of substrate 213 into individual dies. Each of layers 217a, 217b, 217c, 215a, 215b, and 215c for example continuously extends across a substantially uniform thickness over the entire upper surface of substrate 213. Insulating layer 219 may then be deposited on the upper surface of semiconductor layer 215c. Layer 219 is for example deposited to have a substantially constant thickness over the entire upper surface of substrate 213. The stack forming substrate 213 and layers 217a, 217b, 217c, 215a, 215b, 215c, and 219 may then be cut into a plurality of individual dies 211.

After the cutting, each die 211 may be bonded to temporary substrate 201 by the surface of substrate 213 opposite to layers 217a, 217b, 217c, 215a, 215b, 215c, and 219, that is, by the lower surface of substrate 213 in the orientation of FIG. 1B.

Dies 221 may be formed from a deposition substrate 223, for example, made of silicon. Each die 221 comprises a silicon nitride layer 225 arranged on the upper surface (in the orientation of FIG. 1B) of deposition substrate 223. The thickness of layer 225 is for example in the range from 50 nm to 2,000 nm. Each die 221 may further comprise a dielectric layer 227, for example, made of silicon oxide, forming an interface between substrate 223 and silicon nitride layer 225. As an example, layer 227 is in contact, by its lower surface, with the upper surface of substrate 213, and, by its upper surface, with the lower surface of layer 225. The thickness of layer 227 is for example in the range from 100 nm to 2,500 nm. In this example, each die 221 further comprises an insulating layer 229, for example, made of the same material as layer 105, arranged on the upper surface of layer 225, for example, in contact with the upper surface of layer 225. The thickness of layer 229 is for example in the range from 5 to 50 nm, for example, from 10 to 20 nm.

Layers 227, 225, and 229 are successively arranged on the upper surface of deposition substrate 223, before the cutting of substrate 223 into individual dies. Each of layers 227, 225, and 229 for example extends continuously across a substantially uniform thickness over the entire surface of substrate 223. Preferably, layer 225 is formed by a LPCVD-type method ("Low-Pressure Chemical Vapor Deposition"), for example, at a temperature in the order of 800° C. Such a method indeed enables to obtain a stoichiometric $Si_3N_4$ layer, particularly advantageous for the forming of photonic components. The stack comprising substrate 223 and layers 227, 225, and 239 may then be cut into a plurality of dies 221.

After the cutting, each die 221 may be fastened to temporary substrate 201 by the surface of substrate 223 opposite to layers 227, 225, and 229, that is, by the lower surface of substrate 223 in the orientation of FIG. 1B.

The fastening of dies 211 and 221 to temporary substrate 201 may be performed by means of an adhesive layer (not shown) arranged on the upper surface side of substrate 201.

Dies 211 and 213 are for example successively arranged on temporary substrate 201 by means of a pick-and-place tool.

Figure 1C:
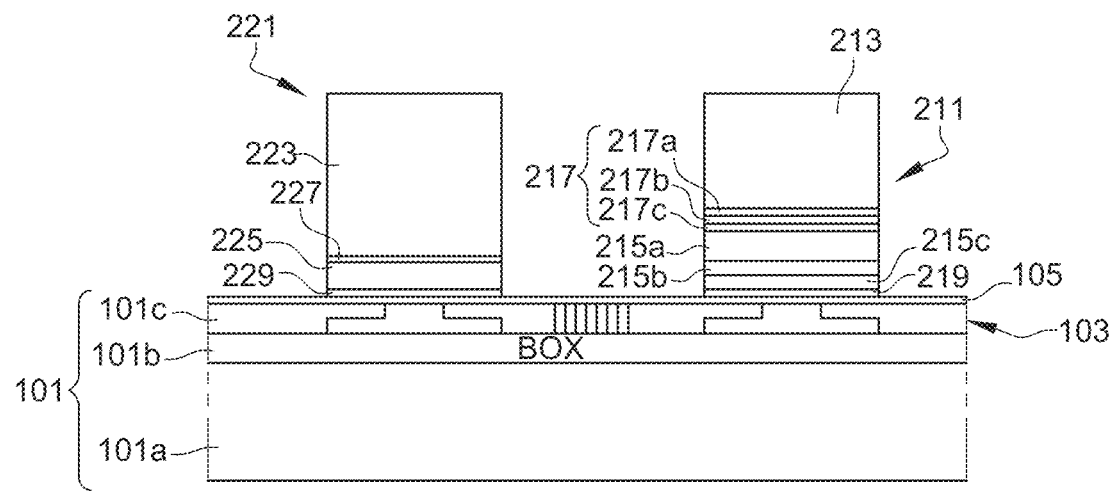
FIG. 1C illustrates another step of an integrated photonic device manufacturing method according to an embodiment.

FIG. 1C illustrates a step of transfer and fastening of dies 211 and 221 onto substrate 101. During this step, dies 211 and 221 are collectively (that is, simultaneously) transferred and fastened onto substrate 101. Temporary substrate 201 (not shown in FIG. 1C) is used as a support handle for the positioning of the dies opposite the photonic circuits integrated in substrate 101. Each of dies 211 and 221 is bonded to substrate 101 by its surface opposite to temporary substrate 201. In FIG. 1C, the orientation of substrate 101 is the same as in FIG. 1A, but the orientation of dies 211 and 221 is inverted with respect to FIG. 1B.

In this example, each die 211 is fastened to substrate 101 by direct bonding or molecular bonding of the lower surface of layer 219 to the upper surface of layer 105. Further, each die 221 is fastened to substrate 101 by direct bonding or molecular bonding of layer 229 to the upper surface of layer 105. Such a bonding is made possible by the fact that dies 211 and 221 are simultaneously transferred onto substrate 101. Indeed, such a bonding requires a surface preparation of substrate 101. Such a preparation for example comprises at least one plasma activation step and one chemical-mechanical polishing step (CMP). To implement such a surface preparation, the bonding surface of substrate 101 should be free of any die.

After the fastening of the dies to substrate 101, temporary support substrate 201 is removed.

The thicknesses of dies 211 and 221 are preferably substantially identical, to ease the bonding of the dies to substrate 101. To obtain dies 211 and 221 having substantially the same thickness, a step of thinning of substrate 223 from its surface opposite to layer 229, and/or a step of thinning of substrate 213 from its surface opposite to layer 219, may be provided before the die cutting step.

Temporary support substrate 201 may be a relatively rigid substrate, for example, a silicon substrate. In this case, the maximum thickness difference between two dies is preferably smaller than 10 µm, to guarantee the obtaining of a contact between each die and the layer 105 coating substrate 101. In the case where temporary support substrate 201 is rigid, the latter may comprise cavities (not shown) which laterally maintain each die (one cavity per die) during the transfer. The cavities may have a depth smaller than the thickness of the dies. As a variant, the dies protrude from the cavities by a height in the range from 10 to 100 µm, for example, by a height in the order of 50 µm. The depth of the cavities is for example in the order of 300 µm.

As a variant, temporary support substrate 201 may be a flexible film, for example, a plastic film. During the transfer, a roller may be rolled over the surface of the film opposite to the dies, to place each die in contact with the layer 105 coating substrate 101. In this case, the tolerance margin relative to the thickness of the dies may be larger. Preferably, the maximum thickness difference between two dies is then smaller than 50 µm. It should be noted that in this variant, the more the dies are distant from one another, the larger the thickness difference between two dies may be. As an example, the thickness difference between two dies may range up to 50 µm between two dies distant by at most 8 µm and will preferably not exceed 10 µm between two dies separated by a distance in the order of 400 µm. A linear rule may be defined between the spacing between two dies and the maximum tolerable difference between the two dies. As an example, this rule may be expressed as follows: $\delta_h = 5.26*10^{-3}*E + 7.89$, where $\delta_h$ is the maximum acceptable thickness difference between two dies and E is the lateral spacing between said two dies, for example, in the range from 400 µm to 32,000 µm.

Figure 1D:
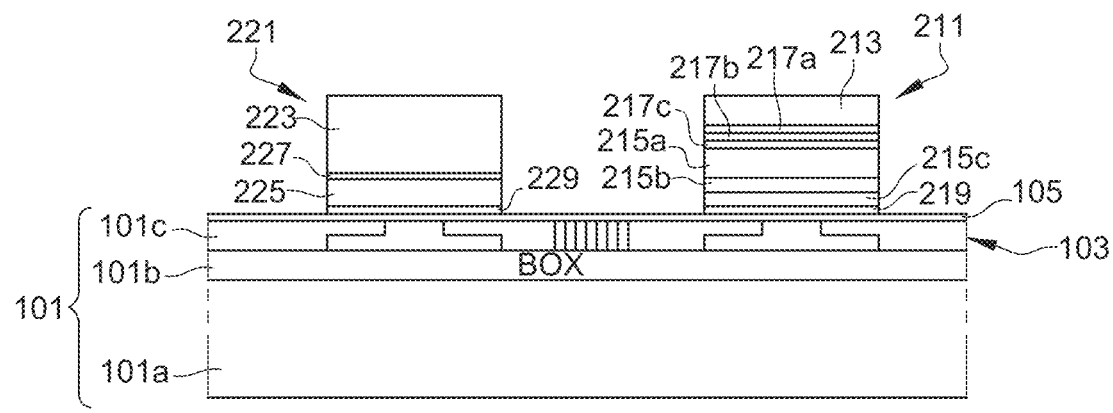
FIG. 1D illustrates another step of an integrated photonic device manufacturing method according to an embodiment.

FIG. 1D illustrates a step subsequent to the transfer step of FIG. 1C, during which dies 211 and 221 are simultaneously thinned by grinding, from their surface opposite to substrate 101. During this step, the substrate 213 of each die 211 and the substrate 223 of each die 221 are partially removed. At the end of the thinning step, dies 211 and 221 have substantially the same thickness, for example, in the range from 20 to 80 µm, for example from 30 to 60 µm. As a variant, the thinning step may be omitted if the dies have been sufficiently pre-thinned before cutting, for example to have a thickness smaller than or equal to 150 µm, for example, in the order of 100 µm, during the transfer step. This is particularly advantageous when temporary support substrate 201 is a flexible film. Indeed, this then enables to limit the risk of tearing or of displacement of the dies during the thinning.

Figure 1E:
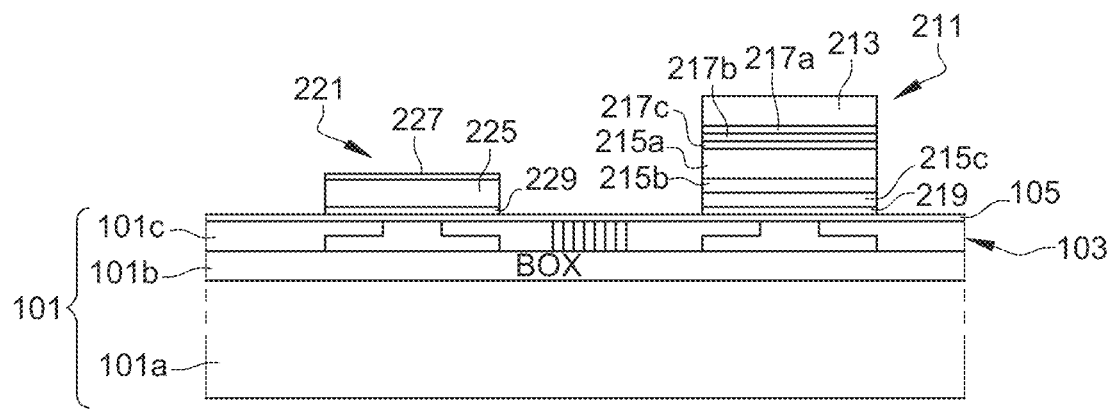
FIG. 1E illustrates another step of an integrated photonic device manufacturing method according to an embodiment.

FIG. 1E illustrates a step subsequent to the thinning step of FIG. 1D, during which the rest of the substrate 233 of dies 221 is removed. In this example, substrate 223 is removed by a selective wet etch method. As an example, substrate 223 is removed by means of a solution capable of etching the material of substrate 223 selectively over the material of layer 227, for example, a solution made up of tetramethyl-ammonium hydroxide (TMAH) or made up of nitric acid ($HNO_3$). The etching stops at the level of the upper surface of layer 227 of dies 221. During this step, the substrate 213 of dies 211 is preserved.

Figure 1F:
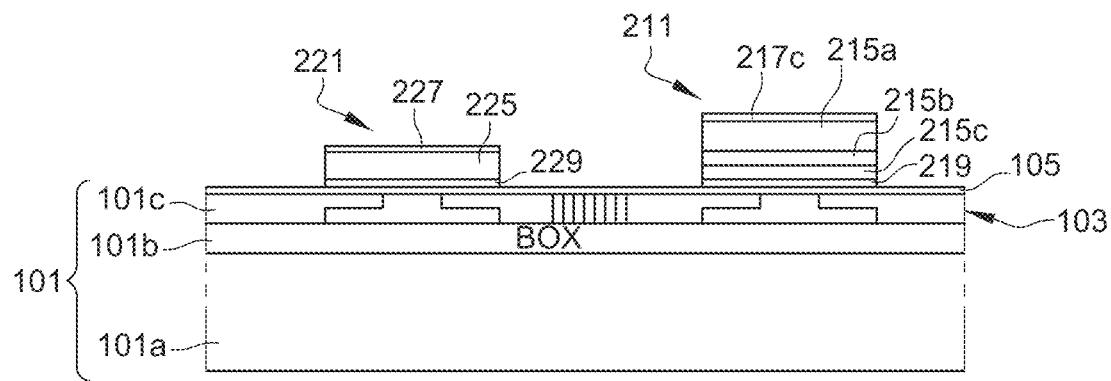
FIG. 1F illustrates another step of an integrated photonic device manufacturing method according to an embodiment.

FIG. 1F illustrates a step subsequent to the thinning step of FIG. 1D, during which the substrate 213 of dies 211 is removed. This step is for example subsequent to the step of FIG. 1E of removal of the substrate 223 of dies 221. In this example, substrate 213 is removed by a selective wet etch method. As an example, during a first etch phase, substrate 213 is removed by means of a solution capable of etching the material of substrate 213 selectively over the material of layer 217a, for example, a hydrochloric acid (HCl) and water ($H_2O$) solution. A second etch phase may then be implemented by means of a solution capable of etching the material of layer 217a selectively over the material of layer 217b, for example, a sulphuric acid ($H_2SO_4$), hydrogen peroxide ($H_2O_2$), and water ($H_2O$) solution. A third etch phase may then be implemented by means of a solution capable of etching the material of layer 217b selectively over the material of layer 217c, for example, a hydrochloric acid (HCl) and water ($H_2O$) solution. The etching stops at the level of the upper surface of layer 217c.

Figure 1G:
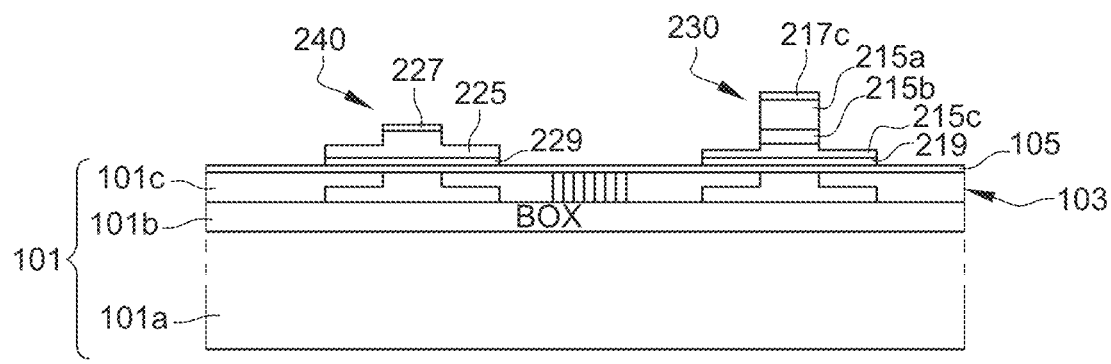
FIG. 1G illustrates another step of an integrated photonic device manufacturing method according to an embodiment.

FIG. 1G very schematically illustrates subsequent steps of forming of photonic components 230, for example, laser diodes, from dies 211, and of photonic components 240, for example, waveguides, from dies 221. The forming of components 230 and 240 particularly comprises steps of structuring of the different materials of dies 211 and 221, for example, lithography and etch methods. The forming of components 230 and 240 has not been detailed, the described embodiments being compatible with usual embodiments of photonic components made up of III-V semiconductor materials and made up silicon nitride.

Once components 230 and 240 have been formed, one or a plurality of encapsulation layers (not shown) may be deposited on the upper surface of the structure. Conductive vias (not shown) may further be formed through the encapsulation layer to allow an electric contacting on active components of the device. Substrate 101 may then be cut into a plurality of individual chips, each comprising a single heterogeneous photonic device comprising one or a plurality of components 103, one or a plurality of components 230, and one or a plurality of components 240.

An advantage of the method described in relation with FIGS. 1A to 1G is that it enables to monolithically integrate, inside and on top of a same substrate 101, photonic components of different natures. The components made up of III-V materials and the components made up of silicon nitride are advantageously arranged on the side of a same surface of the photonic circuit previously formed in substrate 101. Further, the silicon nitride layer 225 used as a base for the forming of components 230 may advantageously be prepared by a high-temperature LPCVD-type method, without risking damaging the components 103 of substrate 101. This is particularly advantageous when components 103 comprise at least one PN junction having a controlled diffusion profile, for example, for the forming of a modulator or of a photodiode.

Various embodiments and variants have been described. Those skilled in the art will understand that certain features of these various embodiments and various may be combined, and other variants will occur to those skilled in the art. In particular, although an example of a method where dies of two different types are transferred onto substrate 101 have been described hereabove, the described embodiments are not limited to this specific case. As a variant, in addition to dies made up of a III-V semiconductor material and dies made up of silicon nitride, dies of one or a plurality of other different types may be transferred onto substrate 101 during the step of FIG. 1C.

Further, although an embodiment where the dies are first fastened to substrate 201, and then structured to form components 230, 240, has been described hereabove, the described embodiments are not limited to this specific case. As a variant, the dies may be structured to form components 230, 240 before being transferred onto substrate 101. In particular, the components 240 based on silicon nitride may be formed before the cutting of the dies, for example, by a method of the type described in the article entitled "Photonic Damascene Process for Low-Loss, High-Confinement Silicon Nitride Waveguides" of M. H. P. Pfeiffer et al. (IEEE JSTQE vol. 24, no. 4, 2018).

Further, although an example of a method where dies of different natures are collectively (that is, simultaneously) transferred onto the upper surface of substrate 101 has been described hereabove, the described embodiments are not limited to this specific case. As a variant, the different dies may be successively transferred onto substrate 101, for example, by means of a pick-and-place tool.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A photonic device manufacturing method, comprising the following successive steps:
    forming at least one first die made of a III-V semiconductor material from a growth substrate and at least one second die made of silicon nitride from a deposition substrate, said at least one first die and said at least one second die being of different natures;
    after cutting said at least one first die and said at least one second die, fastening said at least one first die and said at least one second die on a surface of a temporary support substrate;
    transferring simultaneously said at least one first die and said at least one second die, by means of the temporary support substrate, onto a same surface of a photonic circuit previously formed inside and on top of a first substrate,
    the photonic device manufacturing method further comprising a step of forming photonic components in said at least one first die and said at least one second die.

2. The photonic device manufacturing method according to claim 1, wherein the step of forming photonic components in said at least one first die and said at least one second die is subsequent to the transferring.

3. The photonic device manufacturing method according to claim 1, further comprising, after the transferring, a step of collective thinning of said at least one first die and said at least one second die, by mechanical grinding from their surfaces opposite to the first substrate.

4. The photonic device manufacturing method according to claim 1, further comprising, after the transferring, a step of removal, by chemical etching, of the growth substrate of said at least one first die, and a step of removal, by chemical etching, of the deposition substrate of said at least one second die.

5. The photonic device manufacturing method according to claim 1, wherein, during the transferring, said at least one first die and said at least one second die are fastened by molecular bonding onto said surface of the photonic circuit.

6. The photonic device manufacturing method according to claim 5, wherein the molecular bonding implemented during the transferring is a direct oxide-to-oxide bonding.

7. The photonic device manufacturing method according to claim 1, wherein each at least one second die comprises a stoichiometric $Si_3N_4$ layer deposited by LPCVD.

8. The photonic device manufacturing method according to claim 7, comprising, before the transferring, a step of local doping of the first substrate for forming a PN junction of a component of the photonic circuit.

9. The photonic device manufacturing method according to claim 1, wherein the first substrate is a substrate of silicon on insulator type.

10. The photonic device manufacturing method according to claim 1, wherein the temporary support substrate is a flexible film.

* * * * *